United States Patent
Suzuki et al.

(10) Patent No.: US 9,568,836 B2
(45) Date of Patent: *Feb. 14, 2017

(54) EXPOSURE APPARATUS AND DEVICE MANUFACTURING METHOD USING SAME

(71) Applicant: CANON KABUSHIKI KAISHA, Tokyo (JP)

(72) Inventors: Atsushi Suzuki, Utsunomiya (JP); Shinichi Hirano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/820,931

(22) Filed: Aug. 7, 2015

(65) Prior Publication Data

US 2015/0346607 A1 Dec. 3, 2015

Related U.S. Application Data

(63) Continuation of application No. 13/768,161, filed on Feb. 15, 2013, now Pat. No. 9,134,619.

(30) Foreign Application Priority Data

Feb. 28, 2012 (JP) ................................. 2012-041510

(51) Int. Cl.
*G03F 7/20* (2006.01)

(52) U.S. Cl.
CPC ......... *G03F 7/70191* (2013.01); *G03F 7/7015* (2013.01); *G03F 7/70066* (2013.01); *G03F 7/7085* (2013.01)

(58) Field of Classification Search
CPC G03F 7/70216; G03F 7/70066; G03F 7/7015; G03F 7/70133; G03F 7/70433; G03F 7/7055; G03F 7/7085
See application file for complete search history.

(56) References Cited

U.S. PATENT DOCUMENTS 5,898,480 A 4/1999 Ozawa
6,501,533 B1 12/2002 Murata
(Continued)

FOREIGN PATENT DOCUMENTS

CN 101144985 A 3/2008
CN 101563767 A 10/2009
(Continued)

OTHER PUBLICATIONS

Non-Final Office Action issued in parent U.S. Appl. No. 13/768,161, dated Nov. 24, 2014.
(Continued)

*Primary Examiner* — Steven H Whitesell Gordon
(74) *Attorney, Agent, or Firm* — Rossi, Kimms & McDowell LLP

(57) ABSTRACT

An exposure apparatus includes a light shielding plate that is arranged on a plane conjugate to a substrate plane and shields against light to prevent the light from entering an outer peripheral region outside the circular borderline on the substrate; a first driving unit that rotationally drives the light shielding plate about an axis parallel to an optical axis of the illumination system; a second driving unit that linearly drives the light shielding plate within a plane perpendicular to the optical axis; a detecting unit that detects a light-shielding position; and a control unit that stores a light-shielding position at reference time point and light-shielding positions prior to and after change of the light shielding plate when the light shielding plate is changed after the reference time point, and calculates a variation amount of the light-shielding position based on a light-shielding position detected by the detecting unit at any time point after the light shielding plate is changed, a light-shielding position at the reference time point, and the difference between light-
(Continued)

shielding positions before and after the light shielding plate is changed.

17 Claims, 7 Drawing Sheets

(56) References Cited

U.S. PATENT DOCUMENTS

| | | | |
|---|---|---|---|
| 6,680,774 | B1 | 1/2004 | Heinle |
| 8,760,627 | B2 | 6/2014 | Mori |
| 9,134,619 | B2 * | 9/2015 | Suzuki .................. G03F 7/7015 |
| 2005/0212156 | A1 | 9/2005 | Tokita et al. |
| 2008/0068578 | A1 | 3/2008 | Sakumichi |
| 2008/0073569 | A1 | 3/2008 | Teodorczyk et al. |
| 2010/0302525 | A1 | 12/2010 | Zimmerman et al. |
| 2011/0267595 | A1 | 11/2011 | Mori |

FOREIGN PATENT DOCUMENTS

| | | |
|---|---|---|
| CN | 102236265 A | 11/2011 |
| JP | 1126379 A | 1/1999 |
| JP | 200593683 A | 4/2005 |
| JP | 2011233781 A | 11/2011 |

OTHER PUBLICATIONS

Notification of the First Office Action issued in CN201310062492.2, dated Sep. 19, 2014. English translation provided.

Notice of Allowance issued in parent U.S. Appl. No. 13/768,161, dated May 8, 2015.

Office Action issued in Chinese Patent Application No. 201510549994.7 mailed Nov. 28, 2016. English translation provided.

* cited by examiner

EXPOSURE APPARATUS AND DEVICE MANUFACTURING METHOD USING SAME

BACKGROUND OF THE INVENTION

Field of the Invention

The present invention relates to an exposure apparatus and a device manufacturing method using the same.

Description of the Related Art

An exposure apparatus is an apparatus that transfers a pattern of an original plate (reticle or the like) onto a photosensitive substrate (e.g., wafer, glass plate, and the like, where the surface thereof is coated with a resist layer) via a projection optical system in a lithography step included in manufacturing steps for a semiconductor device, a liquid crystal display device, and the like. In particular, there is a flip chip mounting method as a method for mounting a semiconductor device on a wafer. In the semiconductor device manufacturing processes corresponding to the flip chip mounting method, a step of forming a solder ball on a device (chip) is included. Furthermore, there is a plating method as a method for forming a solder ball. In the plating method, a part of a resist, which comes into contact with an electrode, formed on a conductive film needs to be peeled off in advance in order to bring the conductive film formed on a wafer into contact (conduction) with the electrode of a plating device. For example, when the resist is a negative resist, exposure light is prevented from irradiating the outer peripheral region of a wafer upon exposure by an exposure apparatus. For realizing this, U.S. Pat. No. 6,680,774 discloses an apparatus in which a light shielding plate for shielding the outer peripheral region from light during exposure is arranged above the surface of a wafer. Furthermore, Japanese Patent Laid-Open No. 2011-233781 discloses a lithography apparatus in which a light shielding plate is arranged on a plane optically conjugate to a wafer plane instead of on a wafer. In the lithography apparatus disclosed in Japanese Patent Laid-Open No. 2011-233781, a light shielding plate having a circular-arc at its edge is positionally controlled by a first driving unit that rotationally drives the light shielding plate about an axis parallel to the optical axis of an illumination system and a second driving unit that linearly drives the light shielding plate within a plane perpendicular to the optical axis in order to define an exposure region corresponding to a peripheral shot region located in the outer peripheral region. With the aid of positioning control, the distance (light-shielding width) from the outer periphery of a wafer to the borderline of the outer peripheral region which is shielded against light becomes constant for each peripheral shot region.

However, when a light shielding plate is arranged above the surface of a wafer as disclosed in U.S. Pat. No. 6,680,774, the light shielding plate needs to be retracted at the time of each wafer exchange, which is undesirable in terms of spacing for disposing a drive mechanism for driving the light shielding plate and throughput. On the other hand, even when a light shielding plate is arranged on a plane optically conjugate to a wafer plane as disclosed in Japanese Patent Laid-Open No. 2011-233781, a drive mechanism for driving the light shielding plate is still arranged within the apparatus. For example, in order to shield any desired position on the peripheral shot region from light by means of dual-axis drive such as rotation drive and linear drive, it is required that the second driving unit for linearly driving a light shielding plate is mounted above the first driving unit for rotationally driving the light shielding plate about the optical axis. Consequently, it becomes difficult to dispose a sensor or mounting parts when considering the fact that the position of the light shielding plate is directly measured within the drive mechanism. In addition, it is preferable that the rotating center of the first driving unit matches the optical axis from the viewpoint of optimization of drive amount for the improvement in throughput. At this time, the transmission of rotation to the light shielding plate needs to be performed from the first driving unit due to limitation on the arrangement of the light shielding plate near the rotating center serving as an optical path. However, the transmission of rotation via a gear, a belt, or the like may lead to mechanical deterioration due to wear or the like. Such mechanical deterioration directly affects on the positioning accuracy of light shielding. In particular, a mechanical deterioration caused by long-time use of a lithography apparatus may lead to change in light-shielding position on a wafer, resulting in an adverse effect on the products themselves. In order to avoid such circumstances, it is contemplated that the positioning accuracy of light shielding is inspected by periodically exposing and developing a test wafer but a certain apparatus down time and man-hour of inspection are required.

SUMMARY OF THE INVENTION

The present invention provides an exposure apparatus that is advantageous for forming a specific region which is not irradiated with exposure light on a substrate.

According to an aspect of the present invention, an exposure apparatus that irradiates a pattern formed on an original plate with light emitted from an illumination system to thereby expose an image of the pattern on a substrate via a projection optical system is provided that includes a light shielding plate that is arranged on a plane conjugate to a substrate plane serving as an object plane of the projection optical system in the illumination system, includes a circular-arc overlapping a circular borderline, which defines a region whereupon the image on the substrate is formed, on an inner side of an outer periphery of the substrate at an edge, and shields against light to prevent the light from entering an outer peripheral region outside the circular borderline on the substrate; a first driving unit that rotationally drives the light shielding plate about an axis parallel to an optical axis of the illumination system; a second driving unit that linearly drives the light shielding plate within a plane perpendicular to the optical axis; a detecting unit that detects a light-shielding position at which light is shielded by the light shielding plate; and a control unit that stores a light-shielding position at reference time point and light-shielding positions prior to and after change of the light shielding plate when the light shielding plate is changed after the reference time point, and calculates a variation amount of the light-shielding position based on a light-shielding position detected by the detecting unit at any time point after the light shielding plate is changed, a light-shielding position at the reference time point, and the difference between light-shielding positions before and after the light shielding plate is changed.

According to the present invention, an exposure apparatus that is advantageous for forming a specific region which is not irradiated with exposure light on a substrate may be provided.

Further features of the present invention will become apparent from the following description of exemplary embodiments with reference to the attached drawings.

DESCRIPTION OF THE EMBODIMENTS

Hereinafter, preferred embodiments of the present invention will now be described in detail with reference to the accompanying drawings.

Figure 1:
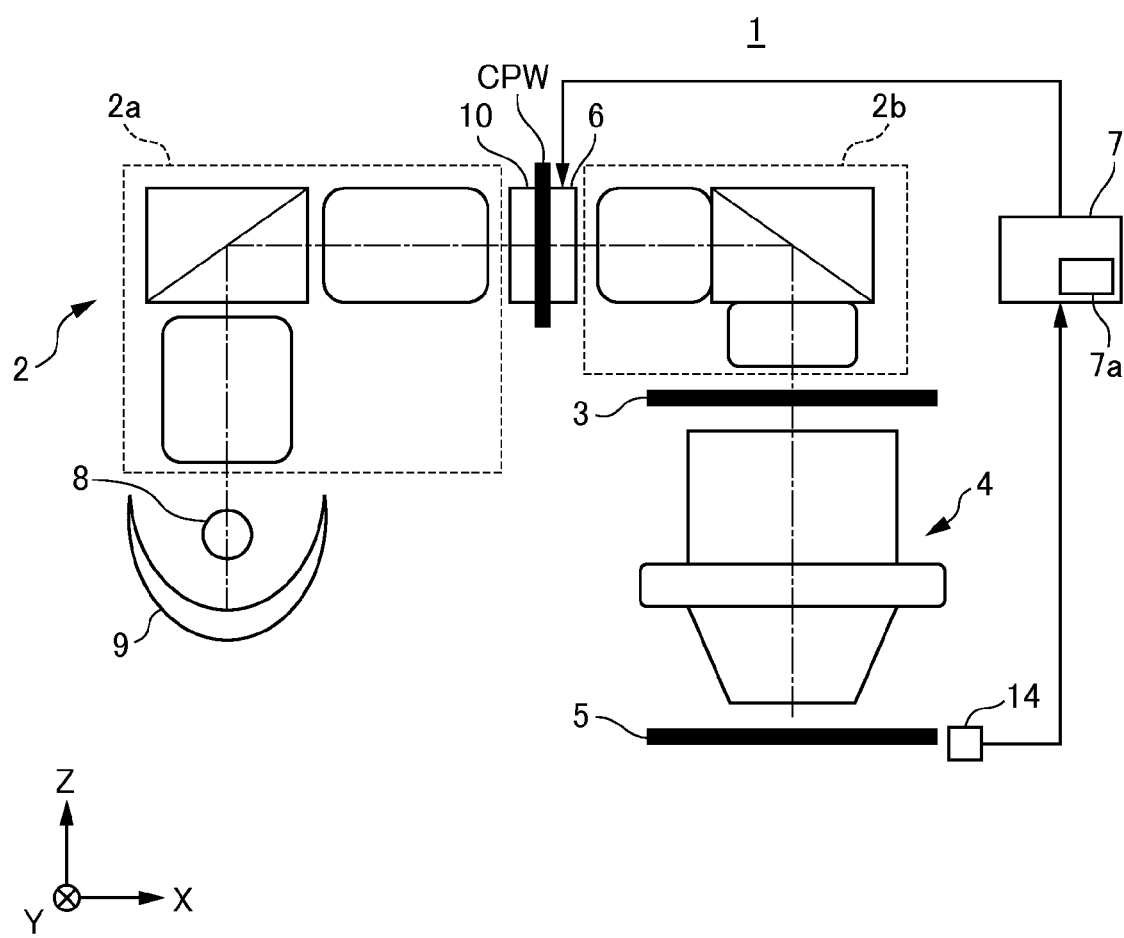
FIG. 1 is a diagram illustrating the configuration of an exposure apparatus according to one embodiment of the present invention.

Firstly, a description will be given of the configuration of an exposure apparatus according to one embodiment of the present invention. The exposure apparatus of the present embodiment is used in a lithography step in the semiconductor device manufacturing steps and performs exposure processing on a wafer, i.e., a substrate. Hereinafter, the exposure apparatus is, for example, a projection exposure apparatus that employs a step-and-repeat system and projects and exposes a pattern formed on a reticle serving as an original plate on a wafer (substrate). FIG. 1 is a schematic diagram illustrating the configuration of an exposure apparatus 1 of the present embodiment. In FIG. 1, a description will be given where the Z axis is aligned parallel to the optical axis of a projection optical system, the Y axis is aligned in the scanning direction of a wafer upon scanning exposure within a plane perpendicular to the Z axis, and the X axis is aligned in the non-scanning direction orthogonal to the Y axis. Firstly, the exposure apparatus 1 includes an illumination optical system 2, a reticle stage that holds a reticle 3, a projection optical system 4, a wafer stage that holds a wafer 5, a light-shielding mechanism 6 that is installed on a wafer conjugate plane CPW, and a control unit 7.

The illumination optical system (illumination system) 2 adjusts light irradiated from a light source 8 and illuminates the reticle 3. The light source 8 of the present embodiment is an ultrahigh-pressure mercury lamp and illuminates light onto the illumination optical system 2 by collecting the light using a light collecting mirror 9. The light source 8 is not limited to a continuum light source such as an ultrahigh-pressure mercury lamp or the like, but may also be a pulse light source such as an ArF excimer laser having a wavelength of about 193 nm, an F2 excimer laser having a wavelength of about 153 nm, or the like. The light collecting mirror 9 may be an elliptical mirror but may also be a facet mirror optimized for increasing concentration at a light collecting point other than an elliptical mirror. In the present embodiment, as shown in FIG. 1, a masking blade 10 is installed on a wafer conjugate plane (hereinafter referred to as "conjugate plane") CPW within the illumination optical system 2. The masking blade 10 is a first light shielding plate that shields against light to prevent the light from entering a region outside the linear sides defining the outer edge of a shot region present on the wafer 5 by changing a region of the reticle 3 to be illuminated as an aperture with a variable opening. In other words, the masking blade 10 defines the shape of one shot region when the exposure apparatus 1 repeatedly performs a pattern transfer to a plurality of shot regions present on the wafer 5. Here, on the basis of the conjugate plane CPW as a reference, the illumination optical system 2 is divided into a first illumination optical system 2a from the light source 8 side to the conjugate plane CPW, and a second illumination optical system 2b from the conjugate plane CPW to a reticle stage (the reticle 3) side to be described below. The first illumination optical system 2a includes a shutter for adjusting exposure amount to the wafer 5 by adjusting opening/closing times, a fly eye lens for creating a uniform illumination, and a filter for cutting out a specific wavelength of light from all of light emitted from the light source 8, or the like. On the other hand, the second illumination optical system 2b includes a masking and focusing lens for projecting an irradiation range defined by the masking blade 10 onto the reticle 3.

The reticle 3 on which the pattern to be transferred (e.g., circuit pattern) is formed is, for example, an original plate made of quartz glass. A reticle stage (not shown) is movable at least in both the X-axis and Y-axis directions while holding the reticle 3. The position of the reticle 3 shown in FIG. 1 means a reticle plane with respect to the conjugate plane CPW. The projection optical system 4 projects and exposes the pattern on the reticle 3, which has been illuminated with exposure light from the illumination optical system 2, onto the wafer 5 with a predetermined magnification (e.g., ¼ or ⅕). As the projection optical system 4, an optical system consisting only of a plurality of optical elements or an optical system (catadioptric optical system) consisting of a plurality of optical elements and at least one concave mirror can be employed. Alternatively, as the projection optical system 4, an optical system consisting of a plurality of optical elements and at least one diffractive optical element such as a kinoform, an entire mirror type optical system, or the like can also be employed. The wafer 5 is a substrate made of, for example, single crystal silicon of which a resist (photoresist) is applied to the surface. The wafer 5 is not limited to a substrate made of single crystal silicon but may also be a substrate made of glass, sapphire, or a compound. Furthermore, a wafer stage (not shown) is movable at least in both the X-axis and Y-axis directions while placing and holding the wafer 5. Here, the position of the wafer 5 shown in FIG. 1 means an object plane of the projection optical system 4 and a wafer plane (substrate plane) with respect to the conjugate plane CPW.

Figure 2:
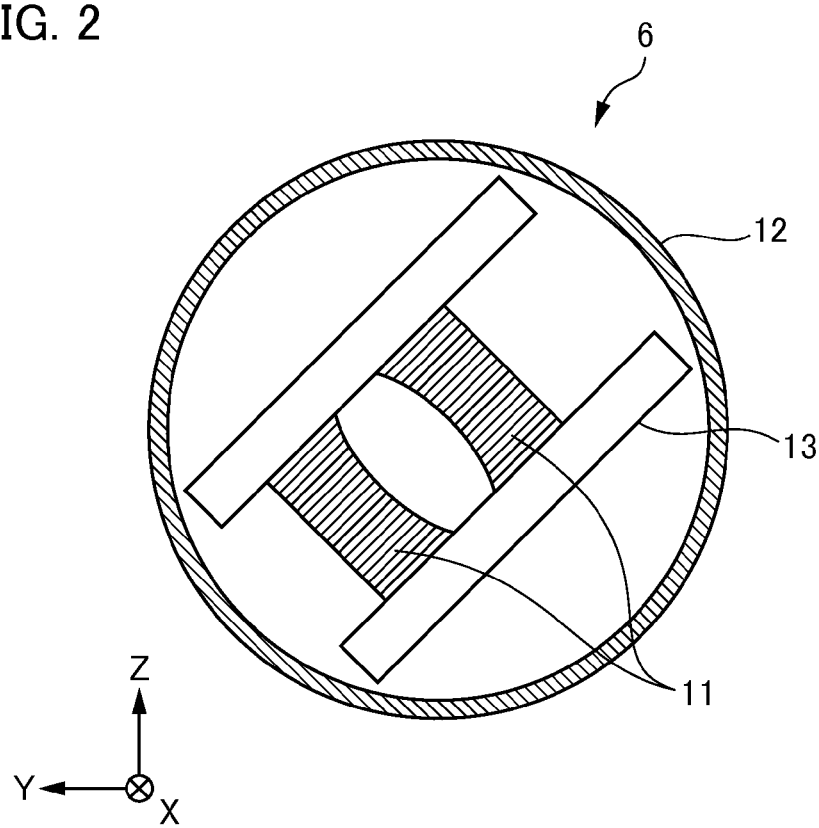
FIG. 2 is a diagram illustrating the configuration of a light-shielding mechanism.

As in the masking blade 10, the light-shielding mechanism 6 is installed on the conjugate plane CPW and shields against light to prevent the light from entering an outer peripheral region inward by a predetermined width from the outer periphery of the wafer 5. FIG. 2 is a schematic diagram illustrating the configuration of the light-shielding mechanism 6. Firstly, the light-shielding mechanism 6 includes a second light shielding plate (light shielding plate) 11 including a circular-arc overlapping a circular borderline on the inner side of the outer periphery of the wafer 5 at an edge thereof. In the second light shielding plate 11 shown in FIG. 2, an opening defined by the circular-arc edges is provided at the central portion of a flat plate member. This is just an example and a circular-arc edge may also be provided at the outer periphery of the flat plate member. As a drive mechanism for changing the position of the second light shielding plate 11, the light-shielding mechanism 6 includes a first driving unit 12 that rotationally drives about an axis parallel to the optical axis of the illumination optical system 2 and a second driving unit 13 that linearly drives within a plane perpendicular to the optical axis. When the exposure apparatus 1 repeatedly exposes a shot region, the light-shielding mechanism 6 also defines the shape of the shot region depending on the exposure position as in the masking blade 10. In particular, in order to shield any desired position on the outer peripheral shot region from light by means of dual-axis drive such as rotation drive and linear drive, it is preferable that the light-shielding mechanism 6 is configured such that the second driving unit 13 for linearly driving is mounted on the first driving unit 12 for rotationally driving as shown in FIG. 2. Furthermore, at this time, it is preferable that the rotating center of the first driving unit 12 upon rotation driving matches the optical axis. As described above, the installation of the masking blade 10 and the second light shielding plate 11 of the light-shielding mechanism 6 on the conjugate plane CPW within one illumination optical system 2 means that either of these is arranged at a position defocused within an allowable range. At this time, it is preferable that the second light shielding plate 11 is arranged at a position optically conjugate to the wafer 5, that is, arranged at a position matching the conjugate plane CPW and the masking blade 10 is arranged at a defocused position. When the amount of defocus upon arrangement is unallowable, the shape of a shot region may be determined by a Cr (chromium) pattern on the reticle 3 and the masking blade 10 may shield from light at a region greater than the shape of the shot region in order to prevent transfer due to Cr defect on the reticle 3. The order of the arrangement positions of the masking blade 10 and the light-shielding mechanism 6 within the illumination optical system 2 is not particularly limited but either of these may be arranged on the light source 8 side. Furthermore, when the effect of the amount of defocus upon arrangement needs to be suppressed, the masking blade 10 and the light-shielding mechanism 6 may be arranged in a different illumination optical system having a different optically conjugate position.

As a mechanism associated with the masking blade 10 and the light-shielding mechanism 6, the exposure apparatus 1 further includes a detecting unit 14 that detects a light-shielding position at which light is shielded by the light-shielding mechanism 6. The detecting unit 14 is a line or spot light quantity detector mounted on the wafer stage. The detection surface of the detecting unit 14 is appropriately moved by the drive of the wafer stage, and is matched with an image formation surface of exposure light upon detection of a light-shielding position. The control unit 7 to be described below calculates a light-shielding position on the wafer 5 based on the detection results by the detecting unit 14 and the stage coordinates on the wafer stage. Here, the light-shielding position to be calculated refers to the borderline of a light-shielding region and an exposure region formed by the masking blade 10 and the second light shielding plate 11 of the light-shielding mechanism 6 upon detection.

The control unit 7 may control the operation and adjustment of the components of the exposure apparatus 1. The control unit 7 is constituted, for example, by a computer or the like and is connected to the components of the exposure apparatus 1 via a line to thereby execute control of the components in accordance with a program or the like. The control unit 7 of the present embodiment executes at least calculation of a light-shielding position with reference to the detection results obtained from the detecting unit 14 and operation control of the light-shielding mechanism 6. Note that a light-shielding mechanism control unit that independently controls the drive of the first driving unit 12 and the second driving unit 13 provided in the light-shielding mechanism 6 may be provided separately from the control unit 7. In addition, the control unit 7 may be integrated with the rest of the exposure apparatus 1 (provided in a shared housing) or may be provided separately from the rest of the exposure apparatus 1 (provided in a separate housing).

Figure 3:
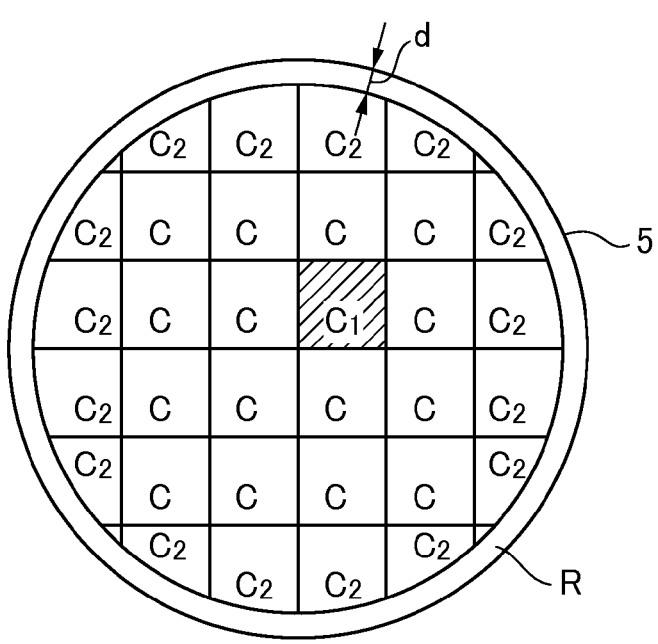
FIG. 3 is a diagram illustrating an exposure region and a light-shielding region on a wafer.

Next, a detailed description will be given of shielding an outer peripheral region on the wafer 5 from light by the light-shielding mechanism 6. Firstly, a description will be given of the arrangement of a shot region as a transfer region on the wafer 5 and the position of a light-shielding region. FIG. 3 is a plan view illustrating a plurality of shot regions C arranged on the surface of the wafer 5 and an outer peripheral region R serving as a light-shielding region. In general, a region onto which an exposure apparatus can transfer a pattern with a single exposure is determined by an image formation region of a projection optical system but is typically smaller than the size of the wafer 5. Thus, the exposure apparatus 1 repeats pattern transfer (exposure) by stepping the wafer 5 using the step-and-repeat system as described above. Among the plurality of shot regions C shown in FIG. 3, a shot region $C_1$ denoted by hatching indicates a region onto which a pattern is to be transferred with a single exposure, and the same pattern can be transferred onto the entire surface of the wafer 5 by repetitive exposure.

Here, assuming that a semiconductor device is flip chip mounted in a series of semiconductor device manufacturing steps including a lithography step using the exposure apparatus 1, a step of forming a solder ball may be included in the series of steps. In the step of forming a solder ball, a region in which a resist is peeled off must be present on the wafer 5 in order to bring the conductive film formed on the surface of the wafer 5 into contact (conduction) with the electrode of a plating device. As shown in FIG. 3, a region in which a resist is peeled off corresponds to the peripheral portion of the surface of the wafer 5, more specifically, an outer peripheral region R inward by a predetermined width (light-shielding width) "d" from the outer periphery of the wafer 5. For example, when the resist applied to the wafer 5 is a negative resist, the outer peripheral region R needs to be shielded against light during exposure. In other words, when the exposure apparatus 1 transfers a pattern onto a peripheral shot region $C_2$ present in the periphery of the wafer 5, the exposure apparatus 1 needs to perform exposure by individually defining a transfer region with respect to the peripheral shot region $C_2$. The outer peripheral region R is shielded against light by changing the position of the second light shielding plate 11 using the first driving unit 12 for rotationally driving and the second driving unit 13 for linearly driving provided in the light-shielding mechanism 6. In the present embodiment, the change in light-shielding position on a wafer 5 from the initial value of rotation attitude to a state after usage is detected in a simple fashion and then the drive offset is reflected to the drive of the second light shielding plate 11, whereby mechanical deterioration of the light-shielding mechanism 6 is corrected to be described below. At this time, a light-shielding width "d" needs to fall within an acceptable accuracy. If light-shielding width "d" does not fall within the accuracy, a warning to that effect is issued.

Figure 4:
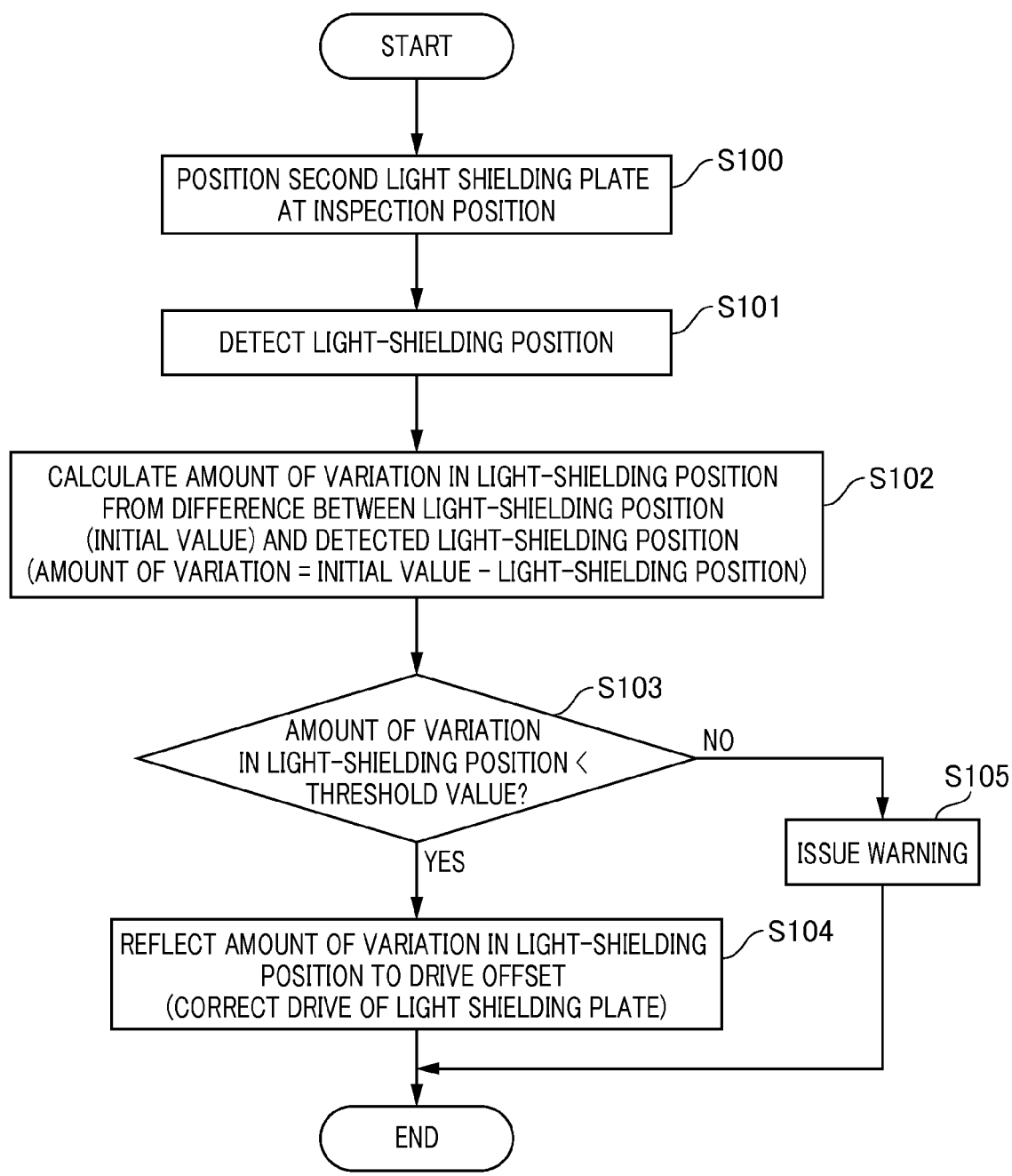
FIG. 4 is a flowchart illustrating the flow of the inspection sequence.

FIG. 4 is a flowchart illustrating the operation sequence (hereinafter referred to as "inspection sequence") of the present embodiment for detecting the change of light-shielding position. Prior to the inspection sequence, the control unit 7 stores a light-shielding position (initial value) and a threshold value at an inspection position detected by the detecting unit 14 in advance in a state where the second light shielding plate 11 of the light-shielding mechanism 6 is located at the specific inspection position at a reference time point. Here, when the light-shielding position is detected by the detecting unit 14, the control unit 7 matches the detection surface of the detecting unit 14 to an image formation surface in the state of inspection position. The reference time point refers to a time point at which normal exposure processing is started after a new second light shielding plate 11 is installed on the light-shielding mechanism 6, i.e., a time point immediately after adjustment of the installation position of the second light shielding plate 11. The initial value and the threshold value of the light-shielding position are set on the control unit 7 and stored in a storage unit 7a. The inspection position is a representative position that is extracted from a wafer layout (arrangement of shot regions set on the wafer 5) set during the inspection sequence and may be provided as either single location or a plurality of locations. The initial value of the light-shielding position may be a value previously measured coordinated with the start of use of the light-shielding mechanism 6 or a data accumulated in advance. Furthermore, the threshold value is a reference value for determining whether the light-shielding width "d" is in an acceptable (unacceptable) state. When the inspection sequence starts at any time point, the control unit 7 firstly drives the first driving unit 12 and the second driving unit 13 of the light-shielding mechanism 6 to thereby position the second light shielding plate 11 at the inspection position (step S100). Here, any time point refers to a time point required for inspection after elapse of a predetermined time from a reference time point, i.e., a time point when there is a possibility that the light-shielding position at which light is shielded by the second light shielding plate 11 may be displaced from a desired position. Next, the control unit 7 matches the detection surface of the detecting unit 14 to an image formation surface in the state of the inspection position and then causes the detecting unit 14 to detect the light-shielding position (step S101). Next, the control unit 7 calculates the amount of variation in light-shielding position from the difference between the light-shielding position (initial value) stored in advance and the light-shielding position detected in step S101 (step S102). At this time, the amount of variation in light-shielding position is obtained by subtracting the light-shielding position detected at any time point from the light-shielding position (initial value). Next, the control unit 7 determines whether or not the amount of variation in light-shielding position derived in step S102 is less than the threshold value stored in advance (the amount of variation in light-shielding position<threshold value) (step S103). Here, when the control unit 7 determines that the amount of variation in light-shielding position is less than the threshold value (YES), the control unit 7 reflects the variation amount to the drive offset of the light-shielding mechanism 6 to thereby correct the drive of the second light shielding plate 11 during normal exposure (step S104). In other words, the corrected drive amount is obtained by adding the amount of variation in light-shielding position to an (original) drive amount at any time point. When there are a plurality of the inspection positions, a plurality of offsets may be used in accordance with the amount of variation in light-shielding position at each position. When a drive offset is reflected to the light-shielding mechanism 6, the control unit 7 may automatically set the amount of offset or the amount of offset may be manually set (input). On the other hand, the control unit 7 determines in step S103 that the amount of variation in light-shielding position is equal to or greater than the threshold value (the amount of variation in light-shielding position≥threshold value) (NO), a warning to that effect is issued to an external (e.g., operator) of the exposure apparatus 1 (step S105). The threshold value may be set as a fixed value in advance but may also be an acceptable amount of variation in light-shielding position obtained as a result of inspecting the light-shielding positional accuracy by exposing and developing a test wafer at a reference time point and confirming the completion accuracy inherent to an apparatus. Furthermore, not only one but also a plurality of threshold values may be set and the control unit 7 may stepwisely warn the change in light-shielding position based on the plurality of threshold values. With this warning, an operator can determine that mechanical deterioration of the light-shielding mechanism 6 has progressed, and can carry out maintenance of the light-shielding mechanism 6 at an appropriate time point. The control unit 7 repeatedly executes the inspection sequence as described above at regular intervals during operation period of the exposure apparatus 1.

In the exposure apparatus 1, the reticle 3 is arranged between the light-shielding mechanism 6 and the wafer 5 as viewed on the optical path of exposure light. Thus, the detection position may be affected by a reticle pattern upon detection of a light-shielding position as described above. Accordingly, it is preferable that the control unit 7 places the reticle 3 out of the irradiation region of exposure light by driving the reticle stage prior to step S100 in the inspection sequence shown in FIG. 4 such that the reticle pattern does not enter the detection position to be detected by the detecting unit 14. It is just an example that movement of the reticle 3 is performed prior to step S100. For example, movement of the reticle 3 may also be performed between steps S100 and S101. In order to avoid influence of a reticle pattern, there is also a method in which a reticle dedicated for inspection on which no pattern is formed is prepared in advance and is mounted on the reticle stage instead of the normal reticle 3 upon inspection. Furthermore, the control unit 7 may also set the fact that the reticle 3 is not mounted on the reticle stage as the starting conditions for the inspection sequence.

Here, the shape of the outer peripheral region R of the wafer 5 changes depending on the size of the wafer 5 (e.g., 8 inches or 12 inches). Thus, the shape of the light shielding plate needs to be changed by changing (exchanging) the second light shielding plate 11 in accordance with the size of the wafer 5 to be processed. When the second light shielding plate 11 is changed, the light-shielding region on the wafer 5 (the shot region C) is changed regardless of mechanical deterioration. Consequently, the light-shielding position at the inspection position is also changed, so that the change in light-shielding position due to mechanical deterioration of the light-shielding mechanism 6 as described above cannot be continuously detected. Thus, in the present embodiment, when the second light shielding plate 11 is changed, the control unit 7 causes the detecting unit 14 to detect the light-shielding positions at the inspection positions prior to and after change of the second light shielding plate 11 and calculates the difference between the light-shielding positions to thereby store the obtained amount of difference between the light-shielding positions (hereinafter referred to as "change difference amount") in the storage unit 7a in advance. The control unit 7 calculates the amount of variation in light-shielding position in consideration of the change difference amount so that the amount of variation in light-shielding position due to mechanical deterioration only can be calculated and the amount of variation in light-shielding position due to mechanical deterioration can be continuously calculated even after change of the second light shielding plate 11. When the change of the second light shielding plate 11 is executed multiple times, the control unit 7 may calculate the difference between light-shielding positions for each change and continuously add the calculated difference to the change difference amount. Furthermore, when there are a plurality of the inspection positions, the control unit 7 may calculate the difference for the number of inspection positions and calculate the amount of variation in light-shielding position by including each change difference amount at each inspection position.

Figure 5:
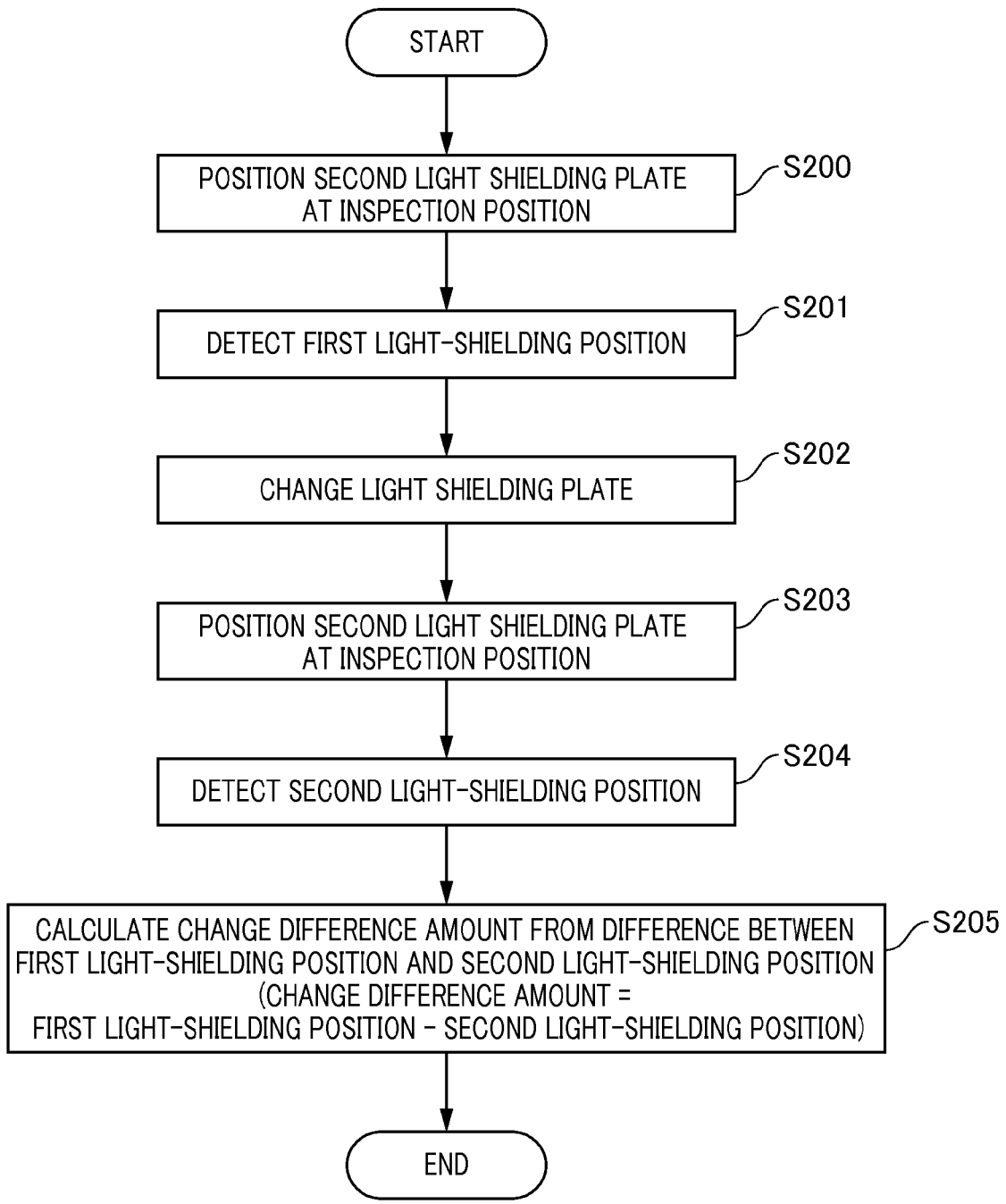
FIG. 5 is a flowchart illustrating the flow of the change difference amount acquisition sequence.

In this case, the control unit 7 acquires the change difference amount by use of the following change difference amount acquisition sequence. FIG. 5 is a flowchart illustrating the change difference amount acquisition sequence of the present embodiment when the change of the second light shielding plate 11 is performed. Firstly, when the control unit 7 starts the inspection sequence by receiving a command for performing the change (e.g., exchange) of the second light shielding plate 11, the control unit 7 positions the second light shielding plate 11 at a specific inspection position prior to the change of the second light shielding plate 11 (step S200). Next, the control unit 7 causes the detecting unit 14 to detect a light-shielding position (first light-shielding position) in the state of the inspection position (step S201). Next, the control unit 7 presents an indication that the second light shielding plate 11 can be changed to an external (e.g., operator), and stands by until the change of the second light shielding plate 11 is completed (step S202: the change of the light shielding plate). Next, after confirmation of the completion of the change of the second light shielding plate 11, the control unit 7 positions a new second light shielding plate 11 to a specific inspection position again (step S203). Next, the control unit 7 causes the detecting unit 14 to detect a light-shielding position (second light-shielding position) in the state of the inspection position (step S204). Next, the control unit 7 calculates a change difference amount from the difference between the first light-shielding position detected in step S201 and the second light-shielding position detected in step S204 (step S205). At this time, the change difference amount is obtained by subtracting the second light-shielding position from the first light-shielding position.

Figure 6:
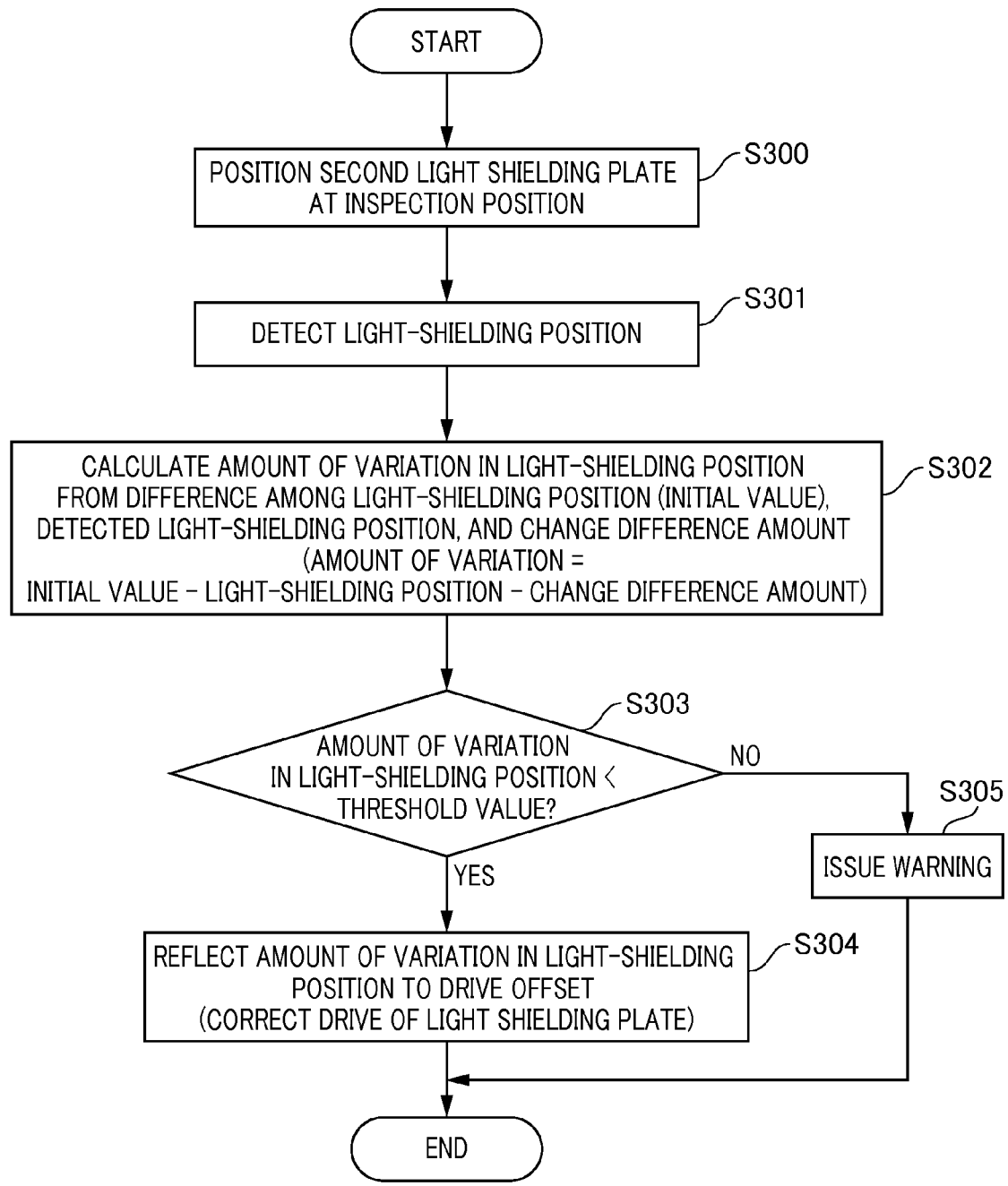
FIG. 6 is a flowchart illustrating the flow of the inspection sequence to which the change difference amount is applied.

In this case, the inspection sequence shown in FIG. 4 is changed to that as shown in FIG. 6 because the inspection sequence shown in FIG. 4 refers to the change difference amount acquired in the change difference amount acquisition sequence shown in FIG. 5. FIG. 6 is a flowchart illustrating the inspection sequence of the present embodiment corresponding to FIG. 4 when the change of the second light shielding plate 11 is included. The inspection sequence shown in FIG. 6 is the same as that shown in FIG. 4 except that only step S302 is different from step S102. In other words, in step S102 shown in FIG. 4, the control unit 7 calculates the amount of variation in light-shielding position from the difference between the light-shielding position (initial value) stored in advance and the light-shielding position detected in step S101. In contrast, in step S302 shown in FIG. 6, the control unit 7 further subtracts the change difference amount from the amount of variation in light-shielding position in step S102, and sets the resulting amount as the amount of variation in light-shielding position in this case. In this manner, even when the second light shielding plate 11 is changed, the control unit 7 can calculate the amount of variation in light-shielding position in consideration of mechanical deterioration only as in the inspection sequence shown in FIG. 4.

Figure 7A:
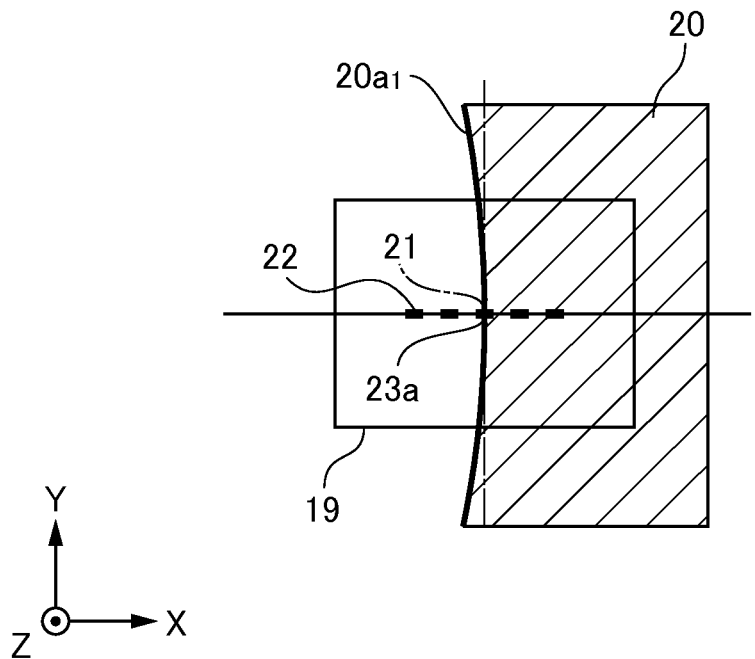
FIGS. 7A and 7B are diagrams illustrating a light-shielding region upon acquisition of a change difference amount.
Figure 7B:
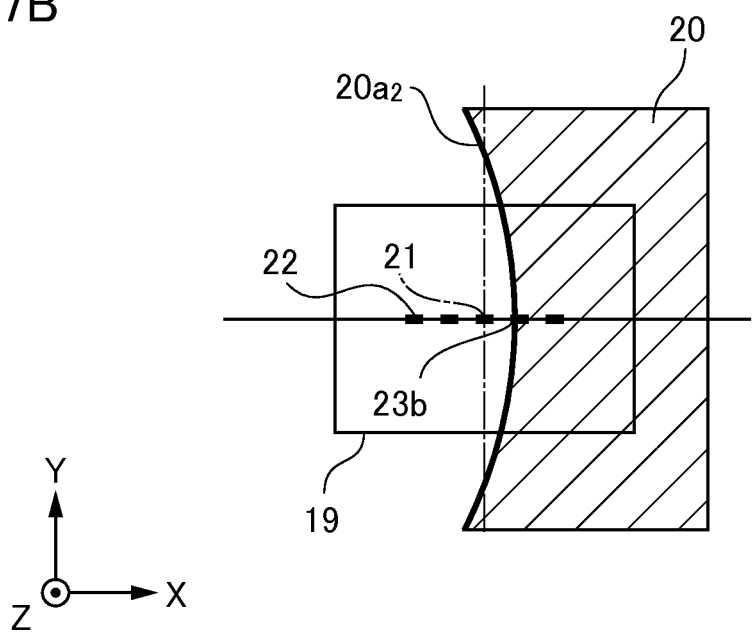
Figure 8:
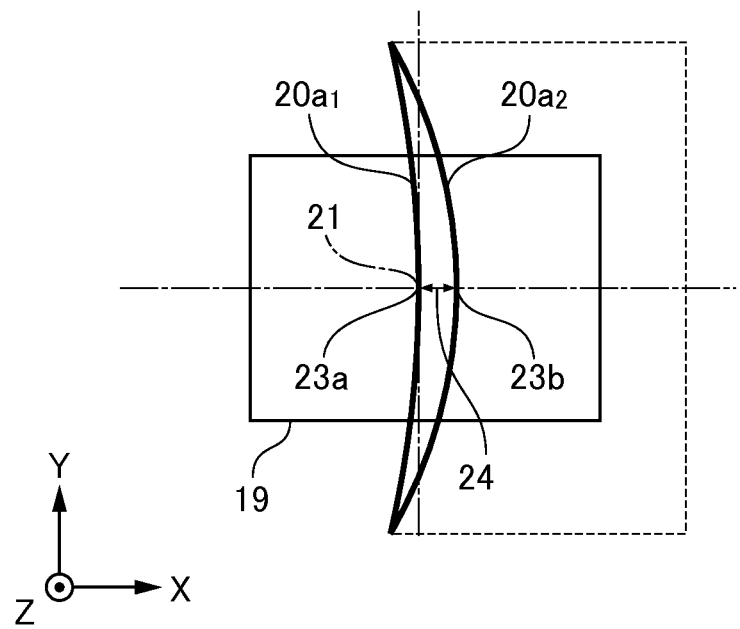
FIG. 8 is a diagram illustrating the difference in shape of a light-shielding region upon acquisition of a change difference amount.

Furthermore, in the change difference amount acquisition sequence shown in FIG. 5, it is preferable that the control unit 7 sets the detection position as follows to thereby cause the detecting unit 14 to detect the light-shielding position. FIGS. 7A and 7B are plan views illustrating an exemplary light-shielding region on the detection surface (image formation surface) of the detecting unit 14 in the state where the second light shielding plate 11 is positioned at the inspection position by the light-shielding mechanism 6. In FIGS. 7A and 7B, the change in light-shielding region due to the difference in the shape of the second light shielding plate 11 is shown. Here, a light-shielding region 20 is formed in accordance with the shape and position of the second light shielding plate 11 on a region 19 corresponding to the outer shape of a shot region C on the detection surface so as to overlap the region 19, and an circular-arc end 20a of the light-shielding region 20 is the borderline between the exposure region and the light-shielding region. In the inspection position, the rotating center 21 of the light-shielding position (the rotation drive of the first driving unit 12) is positioned near the center of the region 19. Firstly, FIG. 7A is a diagram illustrating the state when the second light shielding plate 11 having an edge with a large circular-arc radius is used. In this case, the circular-arc end 20a overlaps the rotating center 21. In contrast, FIG. 7B is a diagram illustrating the state when the second light shielding plate 11 having an edge with a small circular-arc radius is used. As described above, each of the old and new second light shielding plates 11 is installed at the same mechanical position but have a different shape of the light-shielding region 20. In particular, the portion of a circular-arc end $20a_2$ in the state shown in FIG. 7B is located offset from the rotating center 21 toward the light-shielding region 20 side relative to the portion of a circular-arc end $20a_1$ overlapped with the rotating center 21 in the state shown in FIG. 7A. Thus, the detecting unit 14 sets a linear detection region 22, which passes through the rotating center 21 and directs toward the light-shielding region 20 side, on the region 19, and detects points 23a and 23b at which the detection region 22 and the circular-arc end $20a_1$ and the detection region 22 and the circular-arc end $20a_2$ intersect, respectively, as the light-shielding positions. FIG. 8 is a plan view illustrating the difference in shape of the light-shielding regions 20 (the circular-arc ends 20a) shown in FIGS. 7A and 7B. The change difference amount that the control unit 7 acquires in the change difference amount acquisition sequence shown in FIG. 5 is the distance (difference) 24 between the point 23a and the point 23b shown in FIG. 8. Although the detection region 22 is provided at one location in FIGS. 7A, 7B, and 8, the detection region 22 may also be provided at a plurality of locations for improving the accuracy of variation amount. Furthermore, although the light-shielding region 20 indicates the inspection position along the X axis direction as an example shown in FIGS. 7A, 7B, and 8, the rotation drive position at the inspection position may also be provided at any position and may be a single or multiple.

As described above, even when any change in the light-shielding position occurs due to mechanical deterioration of the light-shielding mechanism 6, the exposure apparatus 1 can correct the light-shielding position in a simple fashion without employing a method for inspecting the light-shielding positional accuracy after exposing and developing a test wafer for each inspection. When the amount of variation in light-shielding position is equal to or greater than an acceptable threshold value, the exposure apparatus 1 issues a warning to an external system, and thus, an adverse effect on the products themselves due to change in light-shielding position can be suppressed in advance. The control unit 7 can also specify a driving unit causing the change in light-shielding position upon detection of the change in light-shielding position, and thus, the down time of the exposure apparatus 1 and the man-hour of inspection can be reduced as much as possible in addition to realization of simple correction. Furthermore, even when the second light shielding plate 11 is changed in accordance with the size of the wafer 5 to be processed, the exposure apparatus 1 can calculate the amount of variation in light-shielding position due to mechanical deterioration only, and thus, the same effects as described above may be provided.

As described above, according to the present embodiment, an exposure apparatus that is advantageous for forming a specific region which is not irradiated with exposure light on a wafer may be provided.

Figure 9:
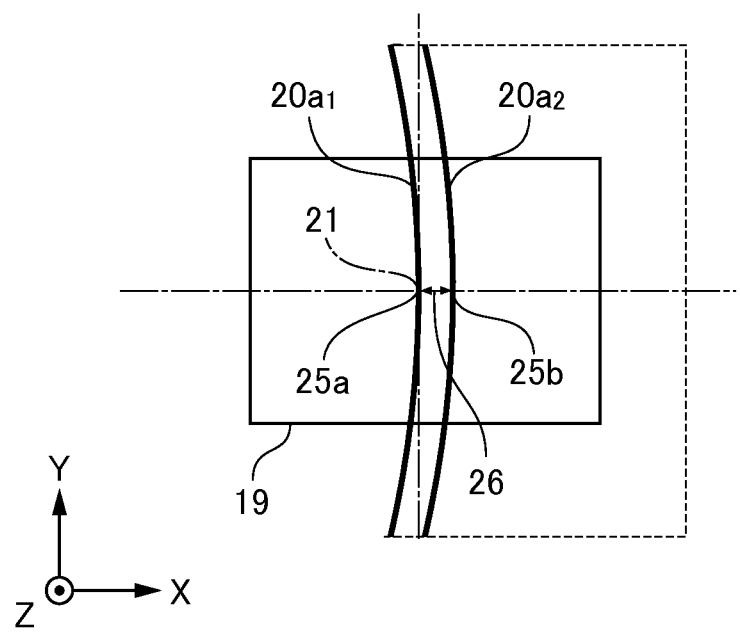
FIG. 9 is a diagram illustrating the difference in shape of a light-shielding region due to a mounting error.

For example, if the amount of variation in light-shielding position is not the distance from the rotating center 21 or the like but the control unit 7 calculates a light-shielding position on design from the shape of the second light shielding plate 11 and the detecting unit 14 detects the amount of change from the light-shielding position, it is contemplated that the influence of the change in shape of light-shielding region may be avoided. However, also in this case, the light-shielding position on design changes due to a mounting error upon installation (change) of a new second light shielding plate 11, and thus, it is difficult to continuously calculate the amount of variation in light-shielding position in consideration of mechanical deterioration only. Furthermore, the same also applies when the second light shielding plate 11 having the same shape is installed again after the second light shielding plate 11 is temporarily changed into a different shape. In such a case, the control unit 7 causes the detecting unit 14 to detect the light-shielding positions prior to and after change in light-shielding region due to a mounting error and stores the change difference amount in the storage unit 7a in advance. Then, if the control unit 7 calculates the amount of variation in light-shielding position with reference to the change difference amount, the control unit 7 can continuously calculate the amount of variation in light-shielding position due to mechanical deterioration in the same manner as described above. FIG. 9 is a plan view illustrating the difference in shape of the light-shielding region 20 (the circular-arc end 20a) due to a mounting error as compared with FIG. 8. In FIG. 9, a point 25a which is a light-shielding position prior to exchange of the second light shielding plate 11 and a point 25b which is a light-shielding position after exchange thereof are shown. In the example shown in FIG. 9, the change difference amount which may be applicable to the control unit 7 is the distance (difference) 26 between the point 25a and the point 25b.

(Device Manufacturing Method)

Next, a method of manufacturing a device (semiconductor device, liquid crystal display device, etc.) as an embodiment of the present invention is described. The semiconductor device is manufactured by a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured by a process in which transparent electrodes are formed. The process of forming a plurality of transparent electrodes includes a step of coating a glass substrate with a transparent conductive film deposited thereon with a photoresist, a step of exposing the glass substrate coated with the photoresist to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-041510 filed on Feb. 28, 2012 which is hereby incorporated by reference herein in its entirety.

What is claimed is:

1. An exposure apparatus that irradiates a pattern formed on an original plate with light emitted from an illumination system to thereby expose an image of the pattern on a substrate via a projection optical system, the exposure apparatus comprising:
    a light shielding plate that is arranged on a plane conjugate to a substrate plane serving as an object plane of the projection optical system in the illumination system, includes a circular-arc overlapping a circular borderline, which defines a region whereupon the image on the substrate is formed, on an inner side of an outer periphery of the substrate at an edge, and shields against light to prevent the light from entering an outer peripheral region outside the circular borderline on the substrate;
    a first driving unit that rotationally drives the light shielding plate about an axis parallel to an optical axis of the illumination system;
    a second driving unit that linearly drives the light shielding plate within a plane perpendicular to the optical axis;
    a detecting unit that detects a light-shielding position at which light is shielded by the light shielding plate; and
    a control unit that stores a light-shielding position at a reference time point and light-shielding positions before and after a replacement of the light shielding plate when the light shielding plate is replaced after the reference time point, and calculates a variation amount of the light-shielding position based on a light-shielding position detected by the detecting unit at a time point after the light shielding plate is replaced and the light-shielding position at the reference time point.

2. The exposure apparatus according to claim 1, wherein the detecting unit sets detection positions of the light-shielding positions before and after the replacement of the light shielding plate on a straight line from a rotating center of the light-shielding position toward the light-shielding position side.

3. The exposure apparatus according to claim 2, wherein, when the variation amount does not exceed a reference value which is determined as an unacceptable state, the control unit corrects a drive amount of the light shielding plate after the time point by reflecting the variation amount to a drive offset of the first driving unit or the second driving unit.

4. The exposure apparatus according to claim 2, wherein, when the variation amount exceeds a reference value which is determined as an unacceptable state, the control unit issues a warning.

5. The exposure apparatus according to claim 1, wherein, when the variation amount does not exceed a reference value which is determined as an unacceptable state, the control unit corrects a drive amount of the light shielding plate after the time point by reflecting the variation amount to a drive offset of the first driving unit or the second driving unit.

6. The exposure apparatus according to claim 1, wherein, when the variation amount exceeds a reference value which is determined as an unacceptable state, the control unit issues a warning.

7. The exposure apparatus according to claim 1, wherein, when the detecting unit detects the light-shielding position, the control unit removes the original plate from an irradiation region of the light.

8. The exposure apparatus according to claim 1, wherein, when the detecting unit detects the light-shielding position, the control unit places an original plate not having the pattern instead of the original plate.

9. The exposure apparatus according to claim 1, wherein the control unit calculates a difference between the light-shielding position detected in an inspection position before the replacement and the light-shielding position detected in the inspection position after the replacement.

10. A device manufacturing method for manufacturing a device, the method comprising:
exposing a substrate using an exposure apparatus; and
developing the exposed substrate,
wherein the exposure apparatus comprises a light shielding plate, a first driving unit, a second driving unit, a detecting unit, and a control unit;
wherein the method includes:
shielding against light to prevent the light from entering an outer peripheral region outside a circular borderline on the substrate, by the light shielding plate that is arranged on a plane conjugate to a substrate plane serving as an object plane of the projection optical system in the illumination system, includes a circular-arc overlapping the circular borderline, which defines a region whereupon the image on the substrate is formed, on an inner side of an outer periphery of the substrate at an edge;
rotationally driving the light shielding plate about an axis parallel to an optical axis of the illumination system, by the first driving unit;
linearly driving the light shielding plate within a plane perpendicular to the optical axis, by the second driving unit;
detecting a light-shielding position at which light is shielded by the light shielding plate, by the detecting unit; and
storing a light-shielding position at a reference time point and light-shielding positions before and after a replacement of the light shielding plate when the light shielding plate is replaced after the reference time point, and calculating a variation amount of the light-shielding position based on a light-shielding position detected by the detecting unit at a time point after the light shielding plate is replaced and the light-shielding position at the reference time point.

11. The device manufacturing method for manufacturing a device according to claim 10,
wherein the calculating is based on a light-shielding position detected by the detecting unit at the predetermined time point, a difference between light-shielding positions before and after the light shielding plate is replaced.

12. An exposure apparatus that irradiates a pattern formed on an original plate with light emitted from an illumination system to thereby expose an image of the pattern on a substrate via a projection optical system, the exposure apparatus comprising:
a light shielding plate including a circular-arc overlapping a circular borderline on an inner side of an outer periphery of the substrate at an edge;
a first driving unit that rotationally drives the light shielding plate about an axis parallel to an optical axis of the illumination system;
a second driving unit that linearly drives the light shielding plate within a plane perpendicular to the optical axis;
a detecting unit that detects a boundary between a shielded region and an exposure region exposed by the light as a light-shielding position, the boundary is defined by the edge; and
a control unit that stores a light-shielding position at a reference time point and light-shielding positions before and after a replacement of the light shielding plate when the light shielding plate is replaced after the reference time point, and calculates a variation amount of the light-shielding position based on a light-shielding position detected by the detecting unit at a time point after the light shielding plate is replaced, a light-shielding position at the reference time point, and light-shielding positions before and after the light shielding plate is replaced.

13. The exposure apparatus according to claim 12, wherein, when the variation amount does not exceed a reference value which is determined as an unacceptable state, the control unit corrects a drive amount of the light shielding plate after the time point by reflecting the variation amount to a drive offset of the first driving unit or the second driving unit.

14. The exposure apparatus according to claim 12, wherein the light-shielding positions before and after the replacement of the light shielding plate are the light-shielding position detected in an inspection position before the replacement and the light-shielding position detected in the inspection position after the replacement.

15. The exposure apparatus according to claim 12, wherein the light-shielding position at the reference time point is the light-shielding position detected in an inspection position at the reference time point; and the light-shielding position detected by the detecting unit at the time point is the light-shielding position detected in the inspection position at the time point.

16. The exposure apparatus according to claim 12, wherein the control unit calculates the variation amount of the light-shielding position based on the light-shielding position detected by the detecting unit at the time point after the light shielding plate is replaced, the light-shielding position at the reference time point, and a difference between light-shielding positions before and after the light shielding plate is replaced.

17. The exposure apparatus according to claim 16, wherein the light-shielding positions before and after the light shielding plate is replaced are the light-shielding position detected in an inspection position before the replacement and the light-shielding position detected in the inspection position after the replacement.

\* \* \* \* \*